United States Patent
Kim et al.

(10) Patent No.: US 11,444,242 B2
(45) Date of Patent: Sep. 13, 2022

(54) RESISTIVE MEMORY DEVICE AND METHOD OF MANUFACTURING THE SAME AND ELECTRONIC DEVICE

(71) Applicant: SAMSUNG ELECTRONICS CO., LTD., Suwon-si (KR)

(72) Inventors: Kwanghee Kim, Seoul (KR); Heejae Lee, Seoul (KR); Oul Cho, Suwon-si (KR); Tae Hyung Kim, Seoul (KR); Eun Joo Jang, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 16/701,293

(22) Filed: Dec. 3, 2019

(65) Prior Publication Data

US 2020/0357990 A1    Nov. 12, 2020

(30) Foreign Application Priority Data

May 8, 2019  (KR) .................. 10-2019-0053613

(51) Int. Cl.
*H01L 45/00* (2006.01)
*H01L 27/24* (2006.01)

(52) U.S. Cl.
CPC .............. *H01L 45/14* (2013.01); *H01L 27/24* (2013.01); *H01L 45/085* (2013.01); *H01L 45/1253* (2013.01); *H01L 45/1608* (2013.01)

(58) Field of Classification Search
CPC ..... H01L 45/14; H01L 45/141; H01L 45/142; H01L 45/143; H01L 45/144; H01L 45/148; B82Y 10/00
See application file for complete search history.

(56) References Cited

U.S. PATENT DOCUMENTS

| | | | |
|---|---|---|---|
| 7,301,199 B2 | 11/2007 | Lieber et al. | |
| 7,342,169 B2 | 3/2008 | Venkatasubramanian et al. | |
| 9,324,562 B1* | 4/2016 | Luther | H01L 21/465 |
| 9,475,028 B2 | 10/2016 | Krishna et al. | |

(Continued)

FOREIGN PATENT DOCUMENTS

| CN | 106701060 A | 5/2017 |
|---|---|---|
| CN | 108447984 A | 8/2018 |

(Continued)

OTHER PUBLICATIONS

K. Kim et al., "Halide-Amine Co-Passivated Indium Phosphide Colloidal Quantum Dots in Tetrahedral Shape," Angew. Chem. Int. Ed. 2016, 55, 3714-3718. Published online: Feb. 5, 2016. (Year: 2016).*

(Continued)

*Primary Examiner* — Peter M Albrecht
(74) *Attorney, Agent, or Firm* — Cantor Colburn LLP

(57) ABSTRACT

A resistive memory device including a first electrode and a second electrode facing each other and a variable resistance layer disposed between the first electrode and the second electrode, wherein the variable resistance layer includes cadmium-free quantum dots (Cd-free quantum dots) and at least a portion of the Cd-free quantum dots include a Cd-free quantum dot including a halide anion on a surface of the Cd-free quantum dot, a method of manufacturing the same and an electronic device.

20 Claims, 6 Drawing Sheets

(56) References Cited

U.S. PATENT DOCUMENTS

| | | | |
|---|---|---|---|
| 2007/0221986 A1* | 9/2007 | Kang | G11C 13/0014 |
| | | | 257/316 |
| 2012/0198591 A1 | 8/2012 | Ohnesorge | |
| 2015/0083969 A1* | 3/2015 | Kim | C09K 11/88 |
| | | | 252/301.6 S |
| 2015/0291422 A1* | 10/2015 | Jeong | C01B 21/0632 |
| | | | 556/105 |
| 2017/0179338 A1* | 6/2017 | Park | H01L 33/24 |
| 2018/0016495 A1 | 1/2018 | Kim et al. | |
| 2019/0112527 A1* | 4/2019 | Moriyama | C09K 11/025 |

FOREIGN PATENT DOCUMENTS

| | | |
|---|---|---|
| KR | 1497758 B1 | 3/2015 |
| KR | 20180008262 A | 1/2018 |

OTHER PUBLICATIONS

Chungwan Gu et al., "Flexible Hybrid Organic-Inorganic Perovskite Memory," ACS Nano, Apr. 19, 2016, pp. 5413-5418, vol. 10.
Rainer Waser et al., "Nanoionics-based resistive switching memories," Nature Materials, Nov. 2007, pp. 833-840, vol. 6.
V. Kannan et al., "Ultra-fast switching in solution processed quantum dot based non-volatile resistive memory," Applied Physics Letters, Oct. 6, 2011, pp. 143504-1-143504-3, vol. 99.

* cited by examiner

RESISTIVE MEMORY DEVICE AND METHOD OF MANUFACTURING THE SAME AND ELECTRONIC DEVICE

CROSS-REFERENCE TO RELATED APPLICATION

This application claims priority to and the benefit of Korean Patent Application No. 10-2019-0053613 filed in the Korean Intellectual Property Office on May 8, 2019, and all the benefits accruing therefrom under 35 U.S.C. § 119, the content of which in its entirety is herein incorporated by reference.

BACKGROUND

1. Field

A resistive memory device, a method of manufacturing the same and an electronic device are disclosed.

2. Description of the Related Art

As the size of a memory device becomes smaller and highly integrated, there may be a limitation in reducing a size of the device. A next generation memory device may replace or supplement existing memory devices.

A resistive memory device is being researched as one of the next generation memory devices. A resistive memory device is a device that uses a material capable of switching at least two resistance states due to a rapid change in resistance depending on an applied voltage.

SUMMARY

An embodiment provides a resistive memory device capable of showing stable electrical characteristics in a simple process.

An embodiment provides a method of manufacturing the resistive memory device.

An embodiment provides an electronic device including the resistive memory device.

According to an embodiment, a resistive memory device includes a first electrode and a second electrode facing each other and a variable resistance layer disposed between the first electrode and the second electrode, wherein the variable resistance layer includes cadmium-free quantum dots (Cd-free quantum dots) and at least a portion of the Cd-free quantum dots include a Cd-free quantum dot including a halide anion on a surface of the Cd-free quantum dot.

The halide anion may be derived from a metal halide and the metal halide may include zinc, indium, lead, gallium, magnesium, lithium, or a combination thereof.

The metal halide may include a zinc fluoride, a zinc chloride, a zinc bromide, a zinc iodide, an indium fluoride, an indium chloride, an indium bromide, an indium iodide, a lead fluoride, a lead chloride, a lead bromide, a lead iodide, a gallium fluoride, a gallium chloride, a gallium bromide, a gallium iodide, a magnesium fluoride, a magnesium chloride, a magnesium bromide, a magnesium iodide, a lithium fluoride, a lithium chloride, a lithium bromide, a lithium iodide, or a combination thereof.

The Cd-free quantum dot may include zinc, indium, or a combination thereof.

The Cd-free quantum dot may include ZnSe, ZnSeTe, InZn, InP, InZnP, or a combination thereof.

The Cd-free quantum dot may include a core including a first semiconductor nanocrystal and a shell on the core, the shell including a second semiconductor nanocrystal different from the first semiconductor nanocrystal.

The first semiconductor nanocrystal may include ZnSe, ZnSeTe, InP, InZnP, or a combination thereof.

The second semiconductor nanocrystal may include zinc, selenium, sulfur, or a combination thereof.

The Cd-free quantum dots may further include an organic ligand on a surface of the Cd-free quantum dots and the organic ligand may include RCOOH, $RNH_2$, $R_2NH$, $R_3N$, $RH_2PO$, $R_2HPO$, $R_3PO$, $RH_2P$, $R_2HP$, $R_3P$, ROH, RCOOR, $RPO(OH)_2$, RHPOOH, $R_2POOH$, or a combination thereof, wherein R is the same or different and is independently a substituted or unsubstituted C1 to C40 aliphatic hydrocarbon, a substituted or unsubstituted C6 to C20 aromatic hydrocarbon, or a combination thereof.

A portion of the Cd-free quantum dots may include Cd-free quantum dots not including a halide anion on a surface of the Cd-free quantum dots.

The variable resistance layer may include a first variable resistance layer including Cd-free quantum dots including a halide anion on a surface of the Cd-free quantum dots and a second variable resistance layer including Cd-free quantum dots not including a halide anion on a surface of the Cd-free quantum dots.

The Cd-free quantum dots not including the halide anion on the surface of the Cd-free quantum dots may include Cd-free quantum dots including a carboxylic acid-containing ligand.

The second variable resistance layer may be disposed on the first variable resistance layer and the variable resistance layer may further include a third variable resistance layer disposed on the second variable resistance layer, the third variable resistance layer including Cd-free quantum dots including a halide anion on a surface of the Cd-free quantum dots.

According to an embodiment, a method of manufacturing a resistive memory device includes providing a first electrode, forming a variable resistance layer on the first electrode and forming a providing electrode on the variable resistance layer to manufacture the resistive memory device, wherein the variable resistance layer includes Cd-free quantum dots, and at least a portion of the Cd-free quantum dots include Cd-free quantum dots including a halide anion on a surface of the Cd-free quantum dots.

The forming of the variable resistance layer may include preparing a dispersion including the Cd-free quantum dots, forming a precursor layer including the Cd-free quantum dots from the dispersion comprising the Cd-free quantum dots, preparing a halide solution including a halide and a polar solvent and providing the halide solution to the precursor layer to convert at least one of the Cd-free quantum dots into the Cd-free quantum dot including the halide anion on the surface of the Cd-free quantum dot.

The forming of the variable resistance layer may include preparing dispersion including the Cd-free quantum dots, preparing a halide solution including a halide and a polar solvent, and mixing the dispersion including the Cd-free quantum dots and the halide solution to convert at least one of the Cd-free quantum dots into the Cd-free quantum dot including the halide anion on the surface of the Cd-free quantum dot.

The mixing of the dispersion including the Cd-free quantum dots and the halide solution may include mixing the dispersion including the Cd-free quantum dots and the halide solution so that an amount of the halide may be about 0.1 weight percent (wt %) to about 10 wt %, based on a total weight of the Cd-free quantum dots.

The forming of the variable resistance layer may include forming a first variable resistance layer including the Cd-free quantum dot including the halide anion on the surface of the Cd-free quantum dot and forming a second variable resistance layer on the first variable resistance layer, the second variable resistance layer including Cd-free quantum dots not including a halide anion on the surface of the Cd-free quantum dots.

The forming of the variable resistance layer may further include forming a third variable resistance layer on the second variable resistance layer, the third variable resistance layer including Cd-free quantum dots including a halide anion on a surface of the Cd-free quantum dots.

According to an embodiment, an electronic device includes the resistive memory device.

Stable resistance switching characteristics may be achieved while simplifying the process.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
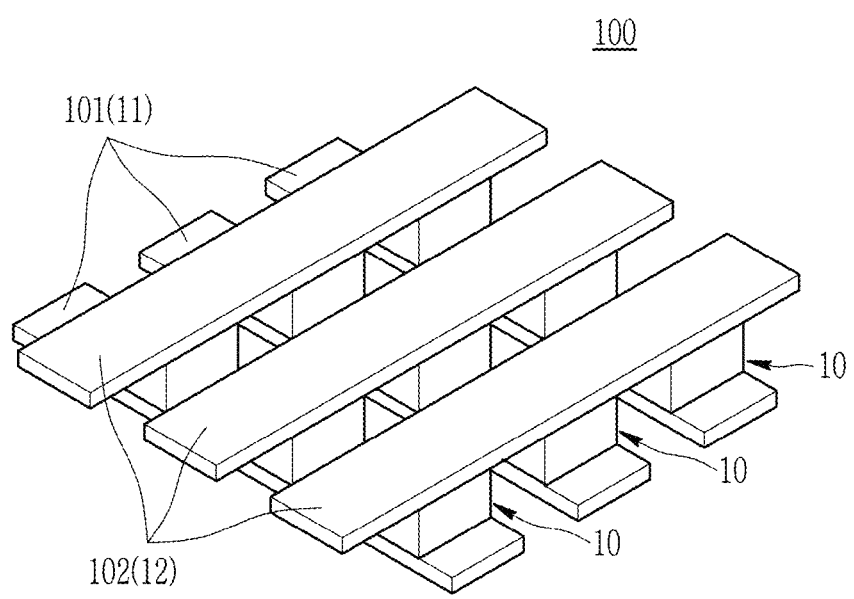
FIG. 1 is a perspective view showing an embodiment of a memory cell array of a resistive memory device.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to a compound or a functional group in which at least one hydrogen is replaced by a substituent that is a C1 to C30 alkyl group, a C2 to C30 alkenyl group, a C2 to C30 alkynyl group, a C6 to C30 aryl group, a C3 to C30 heterocyclic group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (F, Cl, Br, or I), a hydroxy group (—OH), a nitro group —NO$_2$, a cyano group (—CN), an amino group (—NRR', wherein R and R' are independently hydrogen or a C1 to C6 alkyl group), an azido group —N$_3$, an amidino group (—C(=NH)NH$_2$), a hydrazino group (—NHNH$_2$), a hydrazono group (=N NH$_2$, an aldehyde group (—C(=O) H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO3H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, the term "hetero" means that the compound or group includes at least one (e.g., one to three) heteroatom(s), wherein the heteroatom(s) is each independently N, O, S, Si, P, or a combination thereof.

As used herein, when a definition is not otherwise provided, the term "alkylene group" refers to a straight or branched chain, saturated aliphatic hydrocarbon having a valence of at least two. The alkylene group may be optionally substituted with one or more substituents.

As used herein, when a definition is not otherwise provided, the term "arylene group" refers to a functional group having a valence of at least two and formed by the removal of at least two hydrogen atoms from one or more rings of an aromatic hydrocarbon, wherein the hydrogen atoms may be removed from the same or different rings (preferably different rings), each of which rings may be aromatic or nonaromatic. The arylene group may be optionally substituted with one or more substituents.

As used herein, when a definition is not otherwise provided, the term "aliphatic hydrocarbon" refers to a C1 to C30 linear or branched alkyl group, a C2 to C30 linear or branched alkenyl group, or C2 to C30 linear or branched alkynyl group, the term "aromatic hydrocarbon group" refers to a C6 to C30 aryl group, and the term "alicyclic hydrocarbon group" refers to a C3 to C30 cycloalkyl group, a C3 to C30 cycloalkenyl group, or a C3 to C30 cycloalkynyl group.

As used herein, when a definition is not otherwise provided, the term "(meth)acrylate" refers to acrylate, and/or methacrylate, or a combination thereof. The (meth)acrylate may include a (C1 to C10 alkyl)acrylate, a (C1 to C10 alkyl)methacrylate, or a combination thereof.

As used herein, when a definition is not otherwise provided, "alkoxy" means an alkyl group that is linked via an oxygen (i.e., alkyl-O—), for example methoxy, ethoxy, and sec-butyloxy groups.

As used herein, when a definition is not otherwise provided, "alkyl" means a straight or branched chain, saturated, monovalent hydrocarbon group (e.g., methyl or hexyl).

As used herein, when a definition is not otherwise provided, "alkynyl" means a straight or branched chain, monovalent hydrocarbon group having at least one carbon-carbon triple bond (e.g., ethynyl).

As used herein, when a definition is not otherwise provided, an "amine" has the general formula —NRR, wherein each R is independently hydrogen, a C1-C12 alkyl group, a C7-C20 alkylarylene group, a C7-C20 arylalkylene group, or a C6-C18 aryl group.

As used herein, when a definition is not otherwise provided, "arene" means a hydrocarbon having an aromatic ring, and includes monocyclic and polycyclic hydrocarbons wherein the additional ring(s) of the polycyclic hydrocarbon may be aromatic or nonaromatic. Specific arenes include benzene, naphthalene, toluene, and xylene.

As used herein, when a definition is not otherwise provided, "aromatic" means an organic compound or group comprising at least one unsaturated cyclic group having delocalized pi electrons. The term encompasses both hydrocarbon aromatic compounds or groups and heteroaromatic compounds or groups.

As used herein, when a definition is not otherwise provided, "aryl" means a monovalent group formed by the removal of one hydrogen atom from one or more rings of an arene (e.g., phenyl or naphthyl).

As used herein, when a definition is not otherwise provided, "arylalkyl" means a substituted or unsubstituted aryl group covalently linked to an alkyl group that is linked to a compound (e.g., a benzyl is a C7 arylalkyl group).

As used herein, when a definition is not otherwise provided, "cycloalkenyl" means a monovalent group having one or more rings and one or more carbon-carbon double bond in the ring, wherein all ring members are carbon (e.g., cyclopentyl and cyclohexyl).

As used herein, when a definition is not otherwise provided, "cycloalkyl" means a monovalent group having one or more saturated rings in which all ring members are carbon (e.g., cyclopentyl and cyclohexyl).

As used herein, when a definition is not otherwise provided, "cycloalkynyl" means a stable monocyclic or polycyclic aliphatic hydrocarbon having at least one carbon-carbon triple bond, wherein all ring members are carbon (e.g., cyclohexynyl).

As used herein, when a definition is not otherwise provided, "ester" refers to a group of the formula —O(C=O) Rx or a group of the formula —(C=O)ORx wherein Rx is C1 to C28 aromatic organic group or aliphatic hydrocarbon. An ester group includes a C2 to C30 ester group, and specifically a C2 to C18 ester group.

As used herein, when a definition is not otherwise provided, "heteroalkyl" is an alkyl group that comprises at least one heteroatom (e.g., one, two, or three heteroatoms) covalently bonded to one or more carbon atoms of the alkyl group. Each heteroatom is independently nitrogen (N), oxygen (O), sulfur (S), and or phosphorus (P).

Hereinafter, a resistive memory device according to an embodiment is described below with reference to the drawing.

FIG. 1 is a perspective view showing a memory cell array of a resistive memory device according to an embodiment.

Referring to FIG. 1, a resistive memory device 100 according to an embodiment includes a plurality of first signal lines 101 arranged in one direction; a plurality of second signal lines 102 arranged in a direction intersecting the plurality of first signal lines 101, e.g., the plurality of first signal lines 101 may be arranged in a direction that is perpendicular to a direction in which the plurality of second signal lines 102 are arranged; and a plurality of unit memory cells 10 defined by the plurality of first signal lines 101 and the plurality of second signal lines 102.

One of the first signal lines 101 and the second signal lines 102 may be arranged in a row direction and the other in a column direction, e.g., the row direction and the column direction may be perpendicular to one another. One of the first signal lines 101 and the second signal lines 102 may be a word line and the other may be a bit line.

The unit memory cells 10 may store digital information for example by a resistance change between at least two states, including a high resistance state and a low resistance state.

Figure 2:
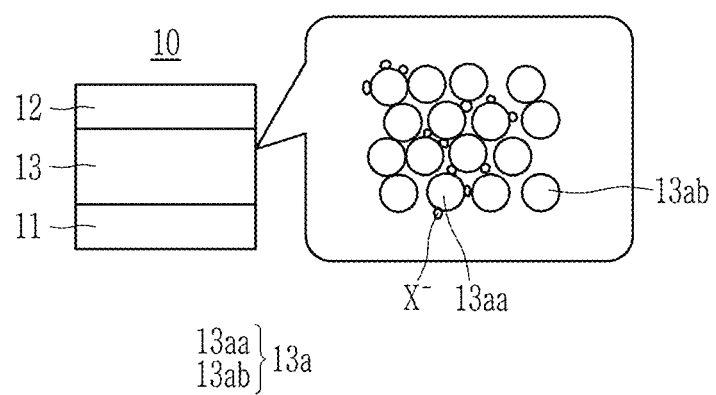
FIG. 2 is a cross-sectional view schematically showing an embodiment of a unit memory cell of a resistive memory device.

FIG. 2 is a cross-sectional view schematically showing an embodiment of a unit memory cell of a resistive memory device.

Referring to FIG. 2, a unit memory cell 10 of a resistive memory device 100 includes a lower electrode 11 and an upper electrode 12 facing each other and a variable resistance layer 13 disposed between the lower electrode 11 and the upper electrode 12.

A substrate may be disposed on a surface of the lower electrode 11 or on a surface of the upper electrode 12. The substrate may be for example made of an inorganic material such as glass; an organic material such as polycarbonate, polymethylmethacrylate, polyethylene terephthalate, polyethylene naphthalate, polyethylene terephthalate, polyimide, polyamide, polyethersulfone, a copolymer thereof, a derivative thereof, or a combination thereof; or a silicon wafer. The substrate may be omitted.

The lower electrode 11 may be the first signal line 101 and the upper electrode 12 may be the second signal line 102.

One of the lower electrode 11 or the upper electrode 12 may be an anode and the other may be a cathode. For example, the lower electrode 11 may be an anode and the upper electrode 12 may be a cathode.

The anode may be made of a conductor having high work function and may be for example made of a metal, a conductive metal oxide, or a combination thereof. The anode may be for example made of a metal or an alloy thereof such as nickel, platinum, vanadium, chromium, copper, zinc, or gold; a conductive metal oxide such as zinc oxide, indium oxide, tin oxide, indium tin oxide (ITO), indium zinc oxide (IZO), or a fluorine-doped tin oxide; or a combination of metal and oxide such as ZnO and Al or $SnO_2$ and Sb, but is not limited thereto.

The cathode may be for example made of a conductor having a lower work function than the anode and may be for example made of a metal, a conductive metal oxide, a conductive polymer, or a combination thereof. The cathode may be for example a metal or an alloy thereof such as aluminum, magnesium, calcium, sodium, potassium, titanium, indium, yttrium, lithium, gadolinium silver, tin, lead, cesium, barium and the like; a multi-layer structure material such as LiF/Al, $LiO_2$/Al, Liq/Al, LiF/Ca and $BaF_2$/Ca, but is not limited thereto.

The lower electrode 11, the upper electrode 12, or a combination thereof may be a light-transmitting electrode and the light-transmitting electrode may be for example made of a conductive oxide such as zinc oxide, indium oxide, tin oxide, indium tin oxide (ITO), indium zinc oxide (IZO), or fluorine doped tin oxide, or a metal thin layer of a single layer or a multilayer. When one of the lower electrode 11 and the upper electrode 12 is a non-light-transmitting electrode, it may be made of for example an opaque conductor such as aluminum (Al), silver (Ag), or gold (Au).

The variable resistance layer 13 may be a layer having a low resistance state (ON state) and a high resistance state (OFF state) due to a rapid change of a resistance value according to a voltage application and may exhibit resistance switching characteristics.

The variable resistance layer 13 includes a plurality of quantum dots 13a.

The quantum dots 13a may be a semiconductor nanocrystal in a general concept and may have various shapes, for example a spherical-shaped semiconductor nanocrystal, a quantum rod and a quantum plate. Herein, the quantum rod may indicate a quantum dot having an aspect ratio of greater than about 1:1, for example an aspect ratio of greater than or equal to about 2:1, greater than or equal to about 3:1, or greater than or equal to about 5:1. For example, the quantum rod may have an aspect ratio of less than or equal to about 50:1, of less than or equal to about 30:1, or of less than or equal to about 20:1.

The quantum dots 13a may have for example a particle diameter (a length of the largest portion for a non-spherical shape) of for example about 1 nanometer (nm) to about 100 nm, about 1 nm to about 80 nm, about 1 nm to about 50 nm, or about 1 nm to about 20 nm.

The quantum dots 13a may include cadmium-free quantum dots (Cd-free quantum dots), and for example cadmium-containing quantum dots may be excluded. As would be understood by one of ordinary skill in the art, when specific metal compounds are manufactured and purified, the metal compounds may still contain trace contaminants of an undesired metal no matter how well purified. Thus trace contaminants. The term "cadmium-free" as used herein does not exclude trace amounts of cadmium arising from contamination of starting materials to make the quantum dots. For example, the cadmium-free quantum dots may contain less than about 10 parts per million by weight (ppm), less than about 5 ppm, less than about 1 ppm, or less than about 0.1 ppm, or 0 ppm of cadmium.

For example, the quantum dots 13a may include a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof. The Group II-VI semiconductor compound may be for example a binary element compound such as ZnS, ZnSe, ZnTe, ZnO, HgS, HgSe, HgTe, MgSe, MgS, or a combination thereof; a ternary element compound such as ZnSeS, ZnSeTe, ZnSTe, HgSeS, HgSeTe, HgSTe, HgZnS, HgZnSe, HgZnTe, MgZnSe, MgZnS, or a combination thereof; a quaternary element compound such as HgZnTeS, HgZnSeS, HgZnSeTe, HgZnSTe, or a combination thereof; or a combination thereof, but is not limited thereto. The Group III-V semiconductor compound may be for example a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a combination thereof; a quaternary element compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof, but is not limited thereto. The Group IV-VI semiconductor compound may be for example a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof, but is not limited thereto. The Group IV semiconductor compound may be for example a singular element semiconductor compound such as Si, Ge, or a combination thereof; a binary element semiconductor compound such as SiC, SiGe, or a combination thereof; or a combination thereof, but is not limited thereto. The Group semiconductor compound may be selected, for example from $CuInSe_2$, $CuInS_2$, CuInGaSe, CuInGaS, or a combination thereof but is not limited thereto. The Group semiconductor compound may be for example $CuInSe_2$, $CuInS_2$, CuInGaSe, CuInGaS, or a combination thereof, but is not limited thereto. The Group II-III-V semiconductor compound may include for example InZnP, but is not limited thereto. For example, the quantum dot 13a may not include a perovskite material.

The quantum dots 13a may include the binary semiconductor compound, the ternary semiconductor compound, or the quaternary semiconductor compound in a substantially uniform concentration or partially different concentration distributions.

For example, the quantum dot 13a may be a binary semiconductor compound, a ternary semiconductor compound, or quaternary semiconductor compound which includes zinc (Zn), indium (In), or a combination thereof.

For example, the quantum dots 13a may be a semiconductor compound including one of zinc (Zn), selenium (Se) and tellurium (Te). For example, the quantum dots 13a may be a Zn—Se semiconductor compound, a Zn—Te semiconductor compound, a Zn—Se—Te semiconductor compound, or a combination thereof. For example, in the Zn—Se—Te semiconductor compound, a content of tellurium (Te) may be less than that of selenium (Se).

For example, the quantum dots 13a may be for example a semiconductor compound including indium (In) and zinc (Zn), phosphorus (P), or a combination thereof. For example, the quantum dots may be an In—Zn semiconductor compound, an In—P semiconductor compound, an In—Zn—P semiconductor compound, or a combination thereof. For example, in the In—Zn semiconductor compound or In—Zn—P semiconductor compound, a mole ratio of zinc (Zn) relative to indium (In) may be greater than or equal to about 25:1, for example greater than or equal to about 28:1, greater than or equal to about 29:1, or greater than or equal to about 30:1 and for example less than or equal to about 55:1, less than or equal to about 50:1, less than or equal to about 45:1, less than or equal to about 40:1, less than or equal to about 35:1, less than or equal to about 34:1, less than or equal to about 33:1, or less than or equal to about 32:1.

The quantum dots 13a may have a core-shell structure wherein one semiconductor compound surrounds other semiconductor compound. For example, the core and the shell of the quantum dot may have an interface and an element of the shell in the interface may have a concentration gradient wherein the concentration of the element(s) of the shell decreases toward the core. For example, a material composition of the shell of the quantum dots 13a has a higher energy bandgap than a material composition of the core of the quantum dots 13a and thereby the quantum dot may exhibit a quantum confinement effect. For example, on the interface between the core and the shell of the quantum dot, an alloyed layer may be present or may not be present. The alloyed layer may include a homogeneous alloy or a gradient alloy. The gradient alloy may have a concentration gradient wherein the concentration of an element of the shell radially changes (e.g., decreases or increases toward the core).

The quantum dot 13a may have one quantum dot core and a multi-layered quantum dot shell surrounding the core. Herein, the multi-layered shell has at least two shells wherein each shell may be a single composition, be an alloy, have a concentration gradient, or a combination thereof. For example, a shell of a multi-layered shell that is far from the core may have a higher energy bandgap than a shell that is near to the core and thereby the quantum dot may exhibit a quantum confinement effect.

For example, the quantum dots 13a having a core-shell structure may include a core including a first semiconductor nanocrystal and a shell disposed on the core and including a second semiconductor nanocrystal. The second semiconductor nanocrystal may be different from the first semiconductor nanocrystal.

For example, the first semiconductor compound may be a semiconductor compound including zinc (Zn) and one of selenium (Se) and tellurium (Te), for example a Zn—Se semiconductor compound, a Zn—Te semiconductor compound, a Zn—Se—Te semiconductor compound, or a combination thereof.

For example, the first semiconductor compound may be a semiconductor compound including indium (In) and zinc (Zn), phosphorus (P), or a combination thereof, for example an In—Zn semiconductor compound, an In—P semiconductor compound, an In—Zn—P semiconductor compound, or a combination thereof.

For example, the second semiconductor compound may include zinc (Zn), selenium (Se), sulfur (S), or a combination thereof, for example a ZnSeS semiconductor compound, a ZnS semiconductor compound, or a combination thereof. For example, the shell may include at least one internal shell disposed near to the core and an outermost shell disposed at the outermost shell of the quantum dot and the internal shell may include ZnSeS and the outermost shell may include SnS. For example, the shell may have a concentration gradient of one component and for example an amount of sulfur (S) may increase as being apart from the core.

Organic ligands may be bound to the surfaces of the quantum dots 13a. The organic ligands may be for example RCOOH, $RNH_2$, $R_2NH$, $R_3N$, $RH_2PO$, $R_2HPO$, $R_3PO$, $RH_2P$, $R_2HP$, $R_3P$, ROH, RCOOR, $RPO(OH)_2$, RHPOOH, $R_2POOH$, or a combination thereof. Herein R may be the same or different and may each independently be a substituted or unsubstituted C1 to C40 aliphatic hydrocarbon, a substituted or unsubstituted C6 to C20 aromatic hydrocarbon, or a combination thereof, for example a C1 to C40 alkyl group, a C2 to C40 alkenyl group, a C2 to C40 alkynyl group, or a combination thereof. For example, the organic ligands may include a carboxylic acid-containing group and for example the carboxylic acid-containing group may be a C6 or more, for example, C8 or more, C12 or more, C15 or more, C16 or more, or C18 or more and C30 or less carboxylic acid-containing aliphatic hydrocarbon. For example, the organic ligands may be oleic acid. For example, the organic ligands may not include a thiol group.

At least a portion of the quantum dots 13a may be quantum dots 13aa including a halide anion ($X^-$) on the surface of the quantum dots 13a. The halide anion ($X^-$) may be for example $F^-$, $Cl^-$, $Br^-$, $I^-$, or a combination thereof. The halide anion ($X^-$) may exist in a form of being chemically or physically bound and/or attached, to the surface of the quantum dot 13a or in a form of substituting, being bound and/or attached to the at least a portion of the organic ligands bound to the surfaces of the quantum dots 13a. The halide anion ($X^-$) may for example passivate the surfaces of the quantum dots 13a. The quantum dots 13aa including the halide anion ($X^-$) may be for example quantum dots treated with a halide. The presence of a halide anion ($X^-$) of the quantum dots 13aa may be confirmed from a peak intensity of halide anion ($X^-$) when measured by for example XPS (X-ray photoelectron spectroscopy).

The halide anion ($X^-$) on the surfaces of the quantum dots 13aa may be derived from a halide compound. The halide compound may be for example a metal halide. The metal halide may include for example zinc (Zn), indium (In), lead (Pb), gallium (Ga), magnesium (Mg), lithium (Li), or a combination thereof, for example a zinc fluoride, a zinc chloride, a zinc bromide, a zinc iodide, an indium fluoride, an indium chloride, an indium bromide, an indium iodide, a lead fluoride, a lead chloride, a lead bromide, a lead iodide, a gallium fluoride, a gallium chloride, a gallium bromide, a gallium iodide, a magnesium fluoride, a magnesium chloride, a magnesium bromide, a magnesium iodide, a lithium fluoride, a lithium chloride, a lithium bromide, a lithium iodide, or a combination thereof. The metal cation included in the metal halide may be for example the same as the metal contained in the quantum dot 13a. For example, the halide compound may be chemically or physically bound and/or attached to the surfaces of the quantum dots 13a (including an organic ligand) and for example may passivate the surfaces of the quantum dots 13a.

A portion of the quantum dots 13a may be quantum dots 13ab not including a halide anion (X−) on the surface. The quantum dots 13ab not including a halide anion (X−) may be quantum dots that are not treated with a halide and may be for example quantum dots comprising, e.g., substituted with, an organic ligand alone. For example, the quantum dots 13ab not including a halide anion (X−) may include Cd-free quantum dots comprising, e.g., substituted with, a carboxylic acid-containing ligand, for example quantum dots substituted with a carboxylic acid-containing group as described herein, such as oleic acid.

The variable resistance layer 13 may exhibit a low resistance state (ON state) or a high resistance state (OFF state), or switching between a low resistance state (ON state) and a high resistance state (OFF state) or vice versa, depending on a voltage, e.g., a voltage range, when the voltage is applied, by including the quantum dots 13aa including the halide anion ($X^-$). The voltage range may be for example about −5 volts (V) to about +5 V, for example about −3 V to about +3 V, about −2 V to about +2 V, or about −1 V to about +1 V.

Hereinafter, an example of a manufacturing method of a resistive memory device will be described.

First, a lower electrode 11 is formed on a substrate (not shown). The lower electrode 11 may be formed by for example sputtering or depositing.

Next, a variable resistance layer 13 is formed on the lower electrode 11. Alternatively, the variable resistance layer 13 may be formed separately and deposited on the lower electrode layer 11, or even on upper electrode 12.

For example, forming the variable resistance layer 13 may include preparing dispersion including quantum dots 13a, and forming a precursor layer, for example coating the dispersion including the quantum dots 13a to form a precursor layer, preparing a halide solution including a halide in a polar solvent and providing a halide solution to the precursor layer to treat at least a portion of quantum dots 13a of the precursor layer with a halide. Preferably, the precursor layer is formed by spin-coating onto the lower electrode layer 11.

The dispersion including quantum dots 13a may be dispersion including quantum dots 13a before halide treatment. The quantum dots 13a may be synthesized by any method (e.g., by an appropriate colloid synthesis method or by a wet chemical process). For example, in the wet chemical process, crystal particles are grown by reacting quantum dot precursor materials in an organic solvent, and organic solvent, organic ligands, or a combination thereof are coordinated, e.g., bound, to the surface of the semiconductor nanocrystal to control a crystal growth. Excess organic material that is not coordinated, e.g., bound, to the surface are removed by a separation process using a solvent (or non-solvent), and quantum dots 13a coordinated with a predetermined organic ligand, e.g., quantum dots 13a to which a predetermined organic ligand is bound, may be obtained. The organic ligand is as described above and may be for example a carboxyl group-containing group. The solvent used in the dispersion may include, for example, an aliphatic hydrocarbon organic solvent, an aromatic hydrocarbon organic solvent, an acetate solvent, or a combination thereof, for example, toluene, hexane, cyclohexane, or a combination thereof, but is not limited thereto.

The precursor layer may be formed by coating the quantum dot dispersion including the quantum dots 13a before halide treatment. The precursor layer may be formed for example by spin coating, inkjet printing, contact printing, or a combination thereof, but is not limited thereto. The precursor layer may optionally be heat-treated and the heat-treatment may be performed for about 1 minute to about 3 hours at a temperature of about 50° C. to about 150° C.

The halide solution may be obtained by dissolving the halide in a polar solvent.

The halide may be for example a metal halide, for example a zinc fluoride, a zinc chloride, a zinc bromide, a zinc iodide, an indium fluoride, an indium chloride, an indium bromide, an indium iodide, a lead fluoride, a lead chloride, a lead bromide, a lead iodide, a gallium fluoride, a gallium chloride, a gallium bromide, a gallium iodide, a magnesium fluoride, a magnesium chloride, a magnesium bromide, a magnesium iodide, a lithium fluoride, a lithium chloride, a lithium bromide, a lithium iodide, or a combination thereof.

The polar solvent may include, for example alcohols having a C1 to C10 linear or branch hydrocarbon group, for example methanol, ethanol, propanol, isopropanol, butanol, pentenol, hexanol, heptanol, or a combination thereof, but is not limited thereto.

A halide concentration of the halide solution may be for example greater than or equal to about 0.001 grams per liter (g/L), greater than or equal to about 0.01 g/L, greater than or equal to about 0.1 g/L, greater than or equal to about 1 g/L, greater than or equal to about 10 g/L, greater than or equal to about 50 g/L, greater than or equal to about 60 g/L, greater than or equal to about 70 g/L, greater than or equal to about 80 g/L, or greater than or equal to about 90 g/L and less than or equal to about 1,000 g/L, less than or equal to about 500 g/L, less than or equal to about 400 g/L, less than or equal to about 300 g/L, less than or equal to about 200 g/L, less than or equal to about 100 g/L, less than or equal to about 90 g/L, less than or equal to about 80 g/L, less than or equal to about 70 g/L, less than or equal to about 60 g/L, less than or equal to about 50 g/L, less than or equal to about 40 g/L, less than or equal to about 30 g/L, less than or equal to about 20 g/L, or less than or equal to about 10 g/L, but is not limited thereto.

The providing of the halide solution to the precursor layer may be performed by spin coating, inkjet printing, contact printing, dropping, e.g., supplying dropwise, and the like. For example, the halide solution is dropped, e.g., supplied dropwise, on the precursor layer and then spin-coated.

Subsequently, washing, e.g., with solvent, removing the solvent, or a combination thereof may be further performed. For example, the precursor layer to which the halide solution is supplied may be washed with a polar solvent such as alcohol and then heat-treated at a predetermined temperature. The heat-treating may be performed at a temperature of about 30° C. to about 200° C. for about 1 minute to about 1 hour. Thus, the at least a portion of the quantum dots 13a may be halide-treated and be converted to the quantum dots 13aa including a halide anion ($X^-$) on the surface.

For example, forming the variable resistance layer 13 may include preparing dispersion including quantum dots 13a, preparing a halide solution including a halide in a polar solvent and mixing the dispersion with the halide solution to halide-treat at least a portion of the quantum dots 13a.

Details for the dispersion including quantum dots 13a and the halide solution are the same as described above.

The dispersion and the halide solution may be mixed so that a halide content may be about 0.1 wt % to about 10 wt %, for example about 0.2 wt % to about 8 wt %, or about 0.5 wt % to about 5 wt %, based on a total weight of the quantum dot 13a.

Subsequently, the mixture of the dispersion and the halide solution is heat-treated to obtain halide-treated quantum dots 13aa and the heat-treatment may be for example performed at a temperature of about 30° C. to about 200° C. for about 1 minute to about 1 hour. Thus, the at least a portion of the quantum dots 13a may be halide-treated and be converted to the quantum dots 13aa including a halide anion ($X^-$) on the surface.

Subsequently, the dispersion including the halide-treated quantum dot 13aa may be formed into the resistance layer 13. For example, the dispersion including the halide-treated quantum dot 13aa may be coated, for example onto the lower electrode, for example by spin coating or inkjet coating, and dried to form the variable resistance layer 13. The drying may be performed at temperatures at which quantum dots are not aggregated and may be performed for example for about 10 minutes to about 1 hour at temperatures of less than or equal to about 150° C. The drying may be performed at temperatures of less than or equal to about 120° C., less than or equal to about 100° C., less than or equal to about 80° C., about 40° C. to about 150° C., about 40° C. to about 120° C., about 40° C. to about 100° C., or about 40° C. to about 80° C. for about 1 hour or less, about 10 minutes to about 1 hour, about 10 minutes to about 40 minutes, or about 10 minutes to about 30 minutes.

Next, the upper electrode 12 is formed on the variable resistance layer 13. The upper electrode 12 may be formed by for example sputtering or depositing.

Hereinafter, an embodiment of a resistive memory device will be described.

Figure 3:
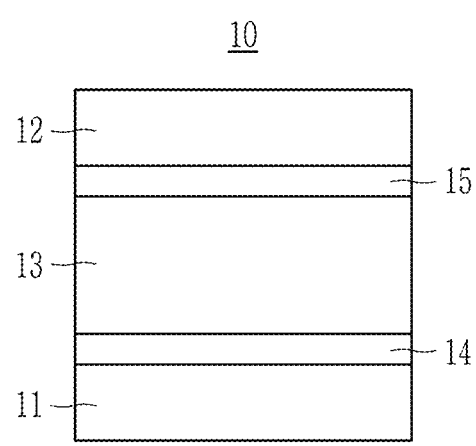
FIG. 3 is a cross-sectional view schematically showing an embodiment of a unit memory cell of a resistive memory device.

FIG. 3 is a cross-sectional view schematically showing an embodiment of a unit memory cell of a resistive memory device.

Referring to FIG. 3, a unit memory cell 10 of a resistive memory device according to an embodiment includes a lower electrode 11 and an upper electrode 12 facing each other and a variable resistance layer 13 disposed between the lower electrode 11 and the upper electrode 12.

The unit memory cell 10 according to an embodiment further includes auxiliary layers 14 and 15 between the lower electrode 11 and the variable resistance layer 13 and between the upper electrode 12 and the variable resistance layer 13. The auxiliary layers 14 and 15 may be one or more layers and may assist in electrical characteristics by controlling injection, transport, or a combination thereof of holes or electrons between the lower electrode 11 and the variable resistance layer 13.

One of the auxiliary layers 14 and 15 may be a hole auxiliary layer for controlling injection, transport, or a combination thereof of holes. The hole auxiliary layer may include, for example poly(9,9-dioctyl-fluorene-co-N-(4-butylphenyl)-diphenylamine (TFB), polyarylamine, poly(N-vinylcarbazole, poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis (4-methoxyphenyl)-benzidine (TPD), 4-bis[N-(1-naphthyl)-N-phenyl-amino]biphenyl ($\alpha$-NPD), m-MTDATA(4,4',4"-tris[phenyl(m-tolyl)amino]triphenylamine), 4,4',4"-tris(N-carbazolyl)-triphenylamine (TCTA), 1,1-bis[(di-4-tolylamino)phenyl]cyclohexane (TAPC), a p-type metal oxide (e.g., $NiO$, $WO_3$, $MoO_3$, etc.), a carbon-based material such as a graphene oxide, or a combination thereof, but is not limited thereto.

The other of the auxiliary layers 14 and 15 may be an electron auxiliary layer for controlling injection, transport, or a combination thereof of electrons. The electron auxiliary layer may include for example 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl)phenyl)quinolone), 8-hydroxyquinolinato lithium (Liq), an n-type metal oxide (e.g., $ZnO$, $ZnMgO$, $HfO_2$, etc.), or a combination thereof, but is not limited thereto.

One of the auxiliary layers 14 and 15 may be omitted.

A method of manufacturing the resistive memory device according to an embodiment may be the same as an aforementioned embodiment and additionally auxiliary layers 14 and 15 may be formed by a solution process or depositing process such as spin coating or inkjet printing.

Hereinafter, an embodiment of a resistive memory device will be described.

Figure 4:
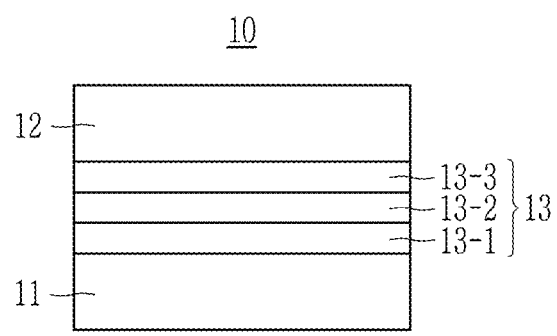
FIG. 4 is a cross-sectional view schematically showing an embodiment of a unit memory cell of a resistive memory device.

FIG. 4 is a cross-sectional view schematically showing an embodiment of a unit memory cell of a resistive memory device.

Referring to FIG. 4, a unit memory cell 10 of a resistive memory device according to an embodiment includes a lower electrode 11 and an upper electrode 12 facing each other and a variable resistance layer 13 disposed between the lower electrode 11 and the upper electrode 12.

The variable resistance layer 13 of the unit memory cell 10 of the resistive memory device according to an embodiment includes a plurality of layers.

For example, the variable resistance layer 13 includes a first variable resistance layer 13-1, a second variable resistance layer 13-2, and a third variable resistance layer 13-3. The first variable resistance layer 13-1 may include quantum dots 13aa including a halide anion ($X^-$) on the surface, the second variable resistance layer 13-2 may include quantum dots 13ab not including a halide anion ($X^-$) on the surface and the third variable resistance layer 13-3 may include quantum dots 13aa including a halide anion ($X^-$) on the surface.

The first variable resistance layer 13-1 may include quantum dots 13aa including a halide anion ($X^-$), the quantum dots 13aa including the halide anion ($X^-$) may be quantum dots treated with a halide as described above and the halide anion ($X^-$) may exist in a form of being bound, e.g., attached, to the surface of the quantum dot 13a or in a form of substituting, being bound, e.g., attached, to the at least a portion of the organic ligands bound to the surfaces of the quantum dots 13a. The specific description is the same as described above. The first variable resistance layer 13-1 may further include quantum dots 13ab not including a halide anion ($X^-$) on the surface.

The second variable resistance layer 13-2 may include quantum dots 13ab not including a halide anion ($X^-$) and may consist of quantum dots 13ab not including a halide anion ($X^-$). The quantum dots 13ab not including a halide anion ($X^-$) on the surface may be quantum dots that are not treated with a halide as described above halide, for example quantum dots substituted with an organic ligand alone. The quantum dots 13ab not including a halide anion ($X^-$) may include, for example Cd-free quantum dots substituted with a carboxylic acid-containing ligand, for example quantum dots substituted with oleic acid. The second variable resistance layer 13-2 may not include quantum dots 13aa including a halide anion ($X^-$).

The third variable resistance layer 13-3 may include quantum dots 13aa including a halide anion ($X^-$), the quantum dots 13aa including the halide anion ($X^-$) may be quantum dots treated with a halide as described above and the halide anion ($X^-$) may exist in a form of being bound and/or attached to the surface of the quantum dot 13a or in a form of substituting, being bound and/or attached to the at least a portion of the organic ligands bound to the surfaces of the quantum dots 13a. The specific description is the same as described above. The third variable resistance layer 13-3 may further include quantum dots 13ab not including a halide anion ($X^-$) on the surface.

In the drawing, the first variable resistance layer 13-1, the second variable resistance layer 13-2 and the third variable resistance layer 13-3 are shown as an example, but one of the first variable resistance layer 13-1, the second variable resistance layer 13-2 and the third variable resistance layer 13-3 may be omitted or more layers may be additionally included. For example, at least greater than or equal to about 2 layers including the quantum dots 13aa including a halide anion ($X^-$) and at least greater than or equal to about 2 layers including the quantum dots 13ab including no halide anion ($X^-$) may be included and the layer including the quantum dots 13aa including the halide anion ($X^-$) and the layer including the quantum dots 13ab including no halide anion ($X^-$) may be alternately disposed.

A method of manufacturing a resistive memory device according to this embodiment may be the same as the aforementioned embodiment(s). The first variable resistance layer 13-1 and the third variable resistance layer 13-3 may be formed in the same manner as the formation of the variable resistance layer 13 described in an aforementioned embodiment. The second variable resistance layer 13-2 may be formed using a solution process such as spin coating, inkjet printing with the dispersion including quantum dots 13a before halide treatment.

Figure 5:
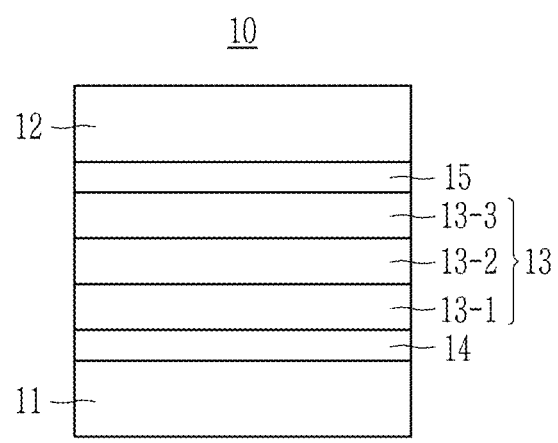
FIG. 5 is a cross-sectional view schematically showing an embodiment of a unit memory cell of a resistive memory device.

FIG. 5 is a cross-sectional view schematically showing an embodiment of a unit memory cell of a resistive memory device.

Referring to FIG. 5, a unit memory cell 10 of a resistive memory device according to an embodiment includes a lower electrode 11 and an upper electrode 12 facing each other, a variable resistance layer 13 disposed between the lower electrode 11 and the upper electrode 12 and auxiliary layers 14 and 15 disposed between the lower electrode 11 and the variable resistance layers 13 and between the upper electrode 12 and the variable resistance layer 13, wherein the variable resistance layer 13 includes a plurality of layers including a first variable resistance layer 13-1, a second variable resistance layer 13-2 and a third variable resistance layer 13-3. The specific description is the same as described above.

One of the auxiliary layers 14 and 15 may be omitted and one of the first variable resistance layer 13-1, the second variable resistance layer 13-2 and the third variable resistance layer 13-3 may be omitted or more layers may be additionally included.

A method of manufacturing a resistive memory device according this embodiment may be the same as the aforementioned embodiment(s).

The aforementioned resistive memory device may exhibit stable resistance switching characteristics by exhibiting a low resistance state and a high resistance state at a predetermined voltage range. The resistive memory device may be operated at a low voltage of less than or equal to about 5 V and have 100 times faster operation speed than a flash memory and simultaneously, manufactured in a simple process and accordingly, used as a non-volatile memory device having a low power consumption, a fast switching speed and high integration density.

The resistive memory device may be applied to all the electronic devices requiring a data storage, for example, effectively applied to a portable electronic device such as a mobile device.

The various embodiments are illustrated in more detail with reference to examples. However, it is understood that this disclosure is not limited by these examples.

Reference Synthesis Example: Synthesis of Quantum Dot (1) Synthesis of ZnSe Core Selenium is dispersed in trioctylphosphine (TOP) to obtain a 2 molar (M) Se/TOP stock solution. 0.125 millimoles (mmol) of zinc acetate and 0.25 mmol of palmitic acid are added to 10 milliliters (mL) of trioctylamine to prepare a trioctylamine solution in a 400 mL reaction flask. The trioctylamine solution is heated under vacuum at 120° C. After one hour, an atmosphere in the reactor is converted into nitrogen. After heating it at 300° C., the Se/TOP stock solution is rapidly injected into the trioctylamine solution and then reaction is performed for 30 hours. When a reaction is complete, the reaction solution is cooled down to room temperature, acetone is added thereto, and precipitates obtained therefrom by centrifugation are dispersed in toluene to obtain ZnSe quantum dot dispersion.

(2) Synthesis of ZnSe Core/ZnS Shell 0.6 mmol of zinc acetate and 1.2 mmol of oleic acid are dissolved in trioctylamine in a 300 mL reactor to prepare a trioctylamine solution and the trioctylamine solution is vacuum-treated at 120° C. for 10 minutes. Subsequently, the reactor is internally substituted with nitrogen and then, heated up to 280° C. Then, the prepared ZnSe quantum dot dispersion is added to the trioctylamine solution within 10 seconds and then, reacted for 120 minutes, while 1 M of S/TOP is added thereto, to obtain a reaction solution (crude). When the reaction is complete, the resultant reaction solution is rapidly cooled down to room temperature (24° C.), ethanol is added thereto to form precipitates, and the precipitates are separated by centrifugation to obtain ZnSe core/ZnS shell quantum dots. The obtained quantum dots are dispersed in toluene to obtain ZnSe core/ZnS shell quantum dot dispersion. Each content of Se and S based on 1 mol of Zn is respectively 0.5 and 1.

Synthesis Example 1: Halide Treatment of Quantum Dot

Zinc chloride ($ZnCl_2$) is dissolved in ethanol to obtain a zinc chloride solution at a concentration of 10 weight percent (wt %). 0.1 ml of the obtained zinc chloride solution is added to the obtained ZnSe core/ZnS shell quantum dot dispersion and then, stirred at 60° C. for 30 minutes to obtain a reaction solution (crude). After the reaction, butanol and ethanol are added to the reaction solution (crude) (a volume ratio of the reaction solution:butanol:ethanol=1:1.5:3) and then, centrifuged at 6,000 revolutions per minute (rpm) for 5 minutes for precipitation and a supernatant is poured away therefrom and redispersed in cyclohexane. This process is twice repeated to obtain halide-treated ZnSe core/ZnS shell quantum dots. The halide-treated ZnSe core/ZnS shell quantum dots are dispersed in octane to prepare halide-treated ZnSe core/ZnS shell quantum dot dispersion.

Whether or not the halide-treated quantum dots include halide may be examined by using X-ray photoelectron spectroscopy (XPS) and specifically, Cl 2p peak intensity is increased compared with that of quantum dots not treated with halide. Referring to XPS, the halide-treated ZnSe core/ZnS shell quantum dot dispersion according to Synthesis Example 1 exhibits about three times higher Cl 2p peak intensity than the non-halide-treated ZnSe core/ZnS shell quantum dot dispersion.

Manufacture of Resistive Memory Device

Example 1

A glass substrate deposited with ITO as an anode is surface-treated with ultraviolet (UV)-ozone for 15 minutes and a 30 nanometer (nm)-thick first hole auxiliary layer is formed thereon by spin-coating a poly(3,4-ethylenedioxythiophene) polystyrene sulfonate (PEDOT:PSS) solution (H. C. Starks GmbH), heat-treating it under an air atmosphere at 150° C. for 10 minutes and then, under a $N_2$ atmosphere at 150° C. for 30 minutes. On the first hole auxiliary layer, a 25 nm-thick second hole auxiliary layer is formed by spin-coating a poly[(9,9-dioctylfluorenyl-2,7-diyl-co (4,4'-(N-4-butylphenyl)diphenylamine] solution (TFB) (Sumitomo Corp.) and heat-treating it at 150° C. for 30 minutes. On the second hole auxiliary layer, a 50 nm-thick variable resistance layer is formed by spin-coating the halide-treated ZnSe core/ZnS shell quantum dot dispersion according to Synthesis Example 1 and heat-treating it at 80° C. for 30 minutes. On the variable resistance layer, a 50 nm-thick electron auxiliary layer is formed by spin-coating ZnMgO dispersion and heat-treating it at 80° C. for 30 minutes and then, a cathode is formed by depositing aluminum (Al) to be 100 nm thick. On the cathode, 100 microliters (μl) of a resin is dropped, covered with a sealing glass and cured by UV curing to manufacture a resistive memory device.

Comparative Example 1

A resistive memory device is manufactured according to the same method as Example 1 except that the ZnSe core/ZnS shell quantum dot dispersion according to Reference Synthesis Example instead of the halide-treated ZnSe core/ZnS shell quantum dot dispersion according to Synthesis Example 1 is spin-coated and heat-treated at 80° C. for 30 minutes to form a 50 nm-thick variable resistance layer.

Evaluation I

On-Off switching characteristics of the resistive memory devices of Example 1 and Comparative Example 1 are evaluated.

The On-Off switching characteristics are evaluated by measuring a change of current characteristics, while a voltage is applied to the devices in a range of −2 volts (V) to +3 V.

Figure 6:
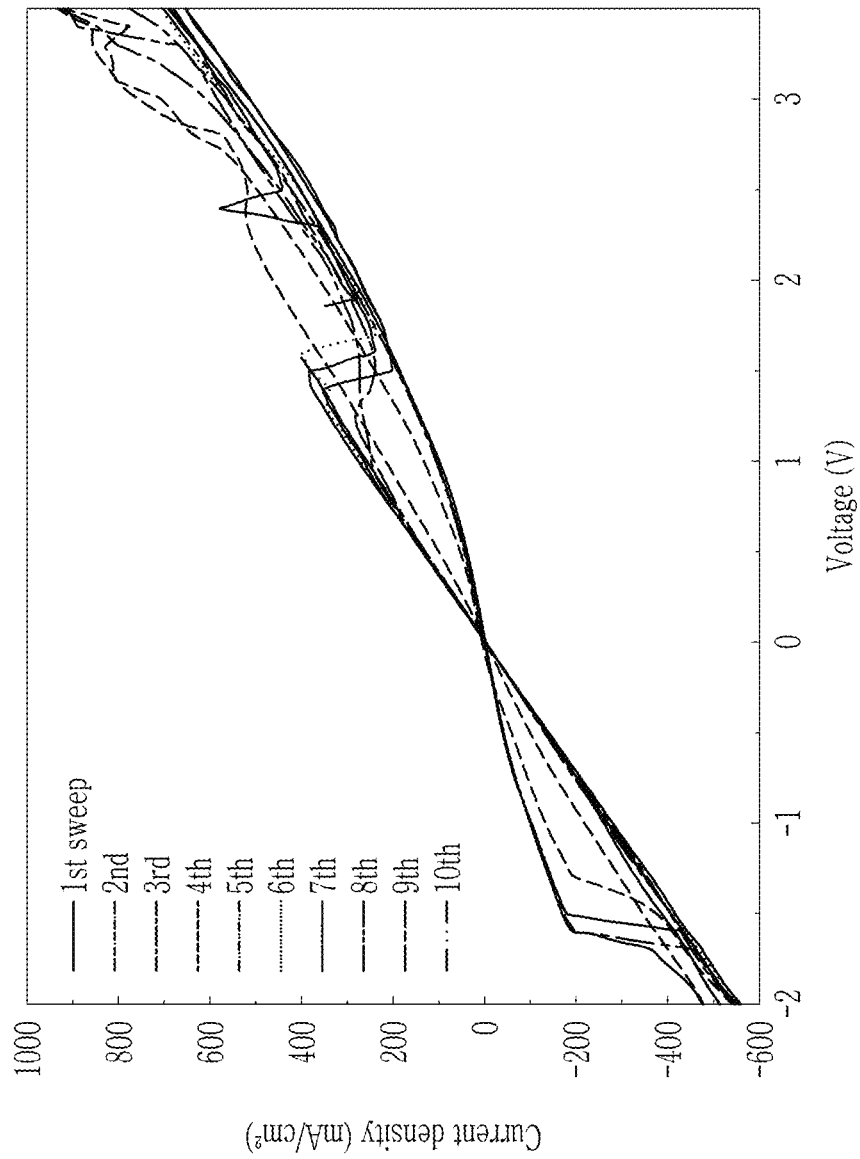
FIG. 6 is a graph of current density (milliamperes per square centimeter ($mA/cm^2$)) versus voltage (volts (V)) showing current-voltage characteristics of the resistive memory device of Example 1.
Figure 7:
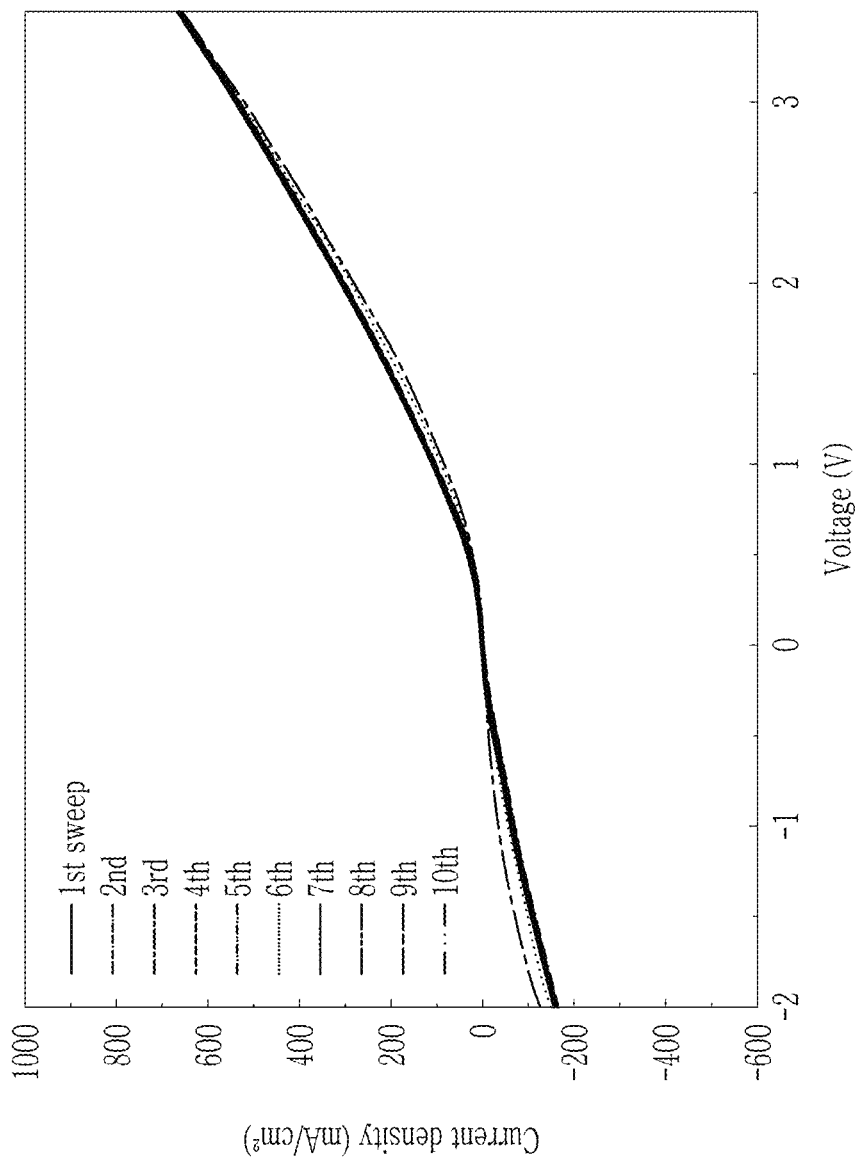
FIG. 7 is a graph of current density ($mA/cm^2$) versus voltage (V) showing current-voltage characteristics of the resistive memory device of Comparative Example 1.

FIG. 6 is a graph showing current-voltage characteristics of the resistive memory device of Example 1 and FIG. 7 is a graph showing current-voltage characteristics of the resistive memory device of Comparative Example 1.

Referring to FIG. 6, the resistive memory device of Example 1 exhibits repetitive switching characteristics between a low resistance state (LRS) and a high resistance state (HRS) depending on a voltage range during a plurality of cycles. Specifically, the resistive memory device of Example 1 exhibits a set process of changing from the high resistance state to the low resistance state in a positive voltage range of 0 V to 3 V and a reset process of changing from the low resistance state to the high resistance state in a negative voltage range of 0 V to −2 V.

On the contrary, referring to FIG. 7, the resistive memory device of Comparative Example 1 exhibits no resistance switching characteristics.

Accordingly, the resistive memory device of Example 1 includes the variable resistance layer including halide-treated quantum dots and thus exhibits resistance switching characteristics in a predetermined voltage range.

Evaluation II

Data retention characteristics of the resistive memory device of Example 1 are evaluated.

The data retention characteristics are evaluated by examining whether or not a difference between ON-resistance and OFF-resistance is maintained as time goes, when a current is measured at a voltage of less than or equal to 0.1 V (reading bias).

Figure 8:
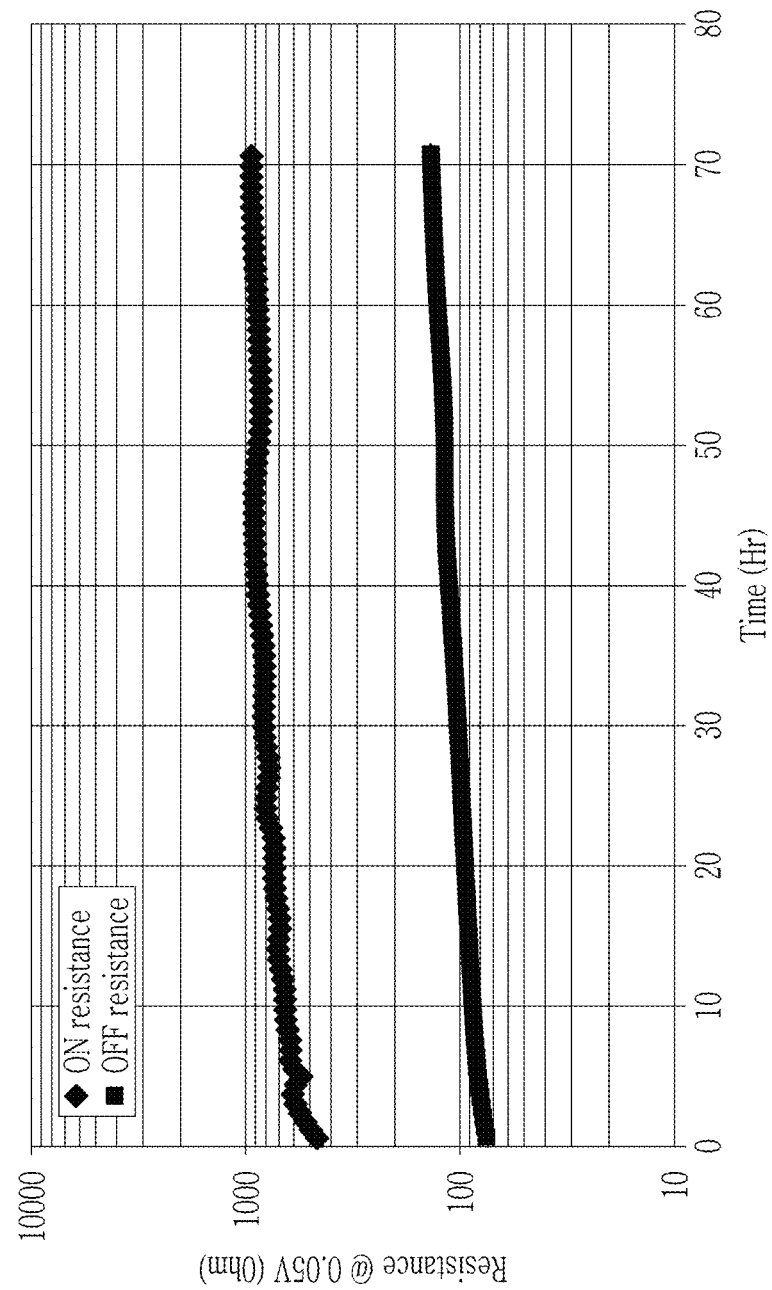
FIG. 8 is a graph of resistance at 0.05 V (ohms) versus time (hours (hr)) showing data retention characteristics of the resistive memory device of Example 1.

FIG. 8 is a graph showing data retention characteristics of the resistive memory device of Example 1.

Referring to FIG. 8, the resistive memory device of Example 1 maintains the difference between On-resistance and Off-resistance under a predetermined bias (less than or equal to 0.1 V).

Accordingly, the resistive memory device of Example 1 includes the variable resistance layer including halide-treated quantum dots and accordingly, exhibits sufficient data retention characteristics and thus non-volatile memory characteristics.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A resistive memory device, comprising:
a first electrode and a second electrode facing each other, and
a variable resistance layer disposed between the first electrode and the second electrode,
wherein the variable resistance layer comprises Cd-free quantum dots,
a first portion of the Cd-free quantum dots comprises a halide anion on the surface thereof, and
a second portion of the Cd-free quantum dots does not comprise the halide anion on the surface thereof.

2. The resistive memory device of claim 1, wherein
the halide anion is derived from a metal halide, and
the metal halide comprises zinc, indium, lead, gallium, magnesium, lithium, or a combination thereof.

3. The resistive memory device of claim 2, wherein the metal halide comprises a zinc fluoride, a zinc chloride, a zinc bromide, a zinc iodide, an indium fluoride, an indium chloride, an indium bromide, an indium iodide, a lead fluoride, a lead chloride, a lead bromide, a lead iodide, a gallium fluoride, a gallium chloride, a gallium bromide, a gallium iodide, a magnesium fluoride, a magnesium chloride, a magnesium bromide, a magnesium iodide, a lithium fluoride, a lithium chloride, a lithium bromide, a lithium iodide, or a combination thereof.

4. The resistive memory device of claim 1, wherein the Cd-free quantum dots comprise zinc, indium, silver or a combination thereof.

5. The resistive memory device of claim 4, wherein the Cd-free quantum dots comprise ZnSe, ZnSeTe, InZn, InP, InZnP, or a combination thereof.

6. The resistive memory device of claim 1, wherein
the Cd-free quantum dots comprise:
a core comprising a first semiconductor nanocrystal, and
a shell disposed on the core, the shell comprising a second semiconductor nanocrystal different from the first semiconductor nanocrystal.

7. The resistive memory device of claim 6, wherein the first semiconductor nanocrystal comprises ZnSe, ZnSeTe, InP, InZnP, or a combination thereof.

8. The resistive memory device of claim 6, wherein the second semiconductor nanocrystal comprises zinc, selenium, sulfur, or a combination thereof.

9. The resistive memory device of claim 1, wherein
the Cd-free quantum dots comprise an organic ligand on the surface thereof, the organic ligand comprising RCOOH, RNH$_2$, R$_2$NH, R$_3$N, RH$_2$PO, R$_2$HPO, R$_3$PO, RH$_2$P, R$_2$HP, R$_3$P, ROH, RCOOR, RPO(OH)$_2$, RHPOOH, R$_2$POOH, or a combination thereof, wherein each R is the same or different and is independently a substituted or unsubstituted C1 to C40 aliphatic hydrocarbon, a substituted or unsubstituted C6 to C20 aromatic hydrocarbon, or a combination thereof.

10. The resistive memory device of claim 1, wherein
the variable resistance layer comprises:
a first variable resistance layer comprising the Cd-free quantum dots comprising the halide anion on the surface thereof, and
a second variable resistance layer comprising the Cd-free quantum dots not comprising the halide anion on the surface thereof.

11. The resistive memory device of claim 10, wherein the Cd-free quantum dots not comprising the halide anion on the surface thereof comprise a carboxylic acid-containing ligand.

12. The resistive memory device of claim 11, wherein
the second variable resistance layer is disposed on the first variable resistance layer, and
the variable resistance layer further comprises a third variable resistance layer disposed on the second variable resistance layer, the third variable resistance layer comprising the Cd-free quantum dots comprising the halide anion on the surface thereof.

13. An electronic device comprising the resistive memory device of claim 1.

14. A method of manufacturing a resistive memory device, comprising:
providing a first electrode,
forming a variable resistance layer on the first electrode, and
providing a second electrode on the variable resistance layer to manufacture the resistive memory device,
wherein the variable resistance layer comprises Cd-free quantum dots, and
a first portion of the Cd-free quantum dots comprises a halide anion on the surface thereof, and
a second portion of the Cd-free quantum dots does not comprise the halide anion on the surface thereof.

15. The method of claim 14, wherein
the forming of the variable resistance layer comprises
preparing a dispersion comprising the Cd-free quantum dots,
forming a precursor layer comprising the Cd-free quantum dots from the dispersion comprising the Cd-free quantum dots,
preparing a halide solution comprising a halide and a polar solvent, and
providing the halide solution to the precursor layer to convert at least one of the Cd-free quantum dots into a Cd-free quantum dot comprising the halide anion on the surface thereof.

16. The method of claim 14, wherein
the forming of the variable resistance layer comprises
preparing a dispersion comprising the Cd-free quantum dots,
preparing a halide solution comprising a halide and a polar solvent, and
mixing the dispersion comprising the Cd-free quantum dots and the halide solution to convert at least one of the Cd-free quantum dots into a Cd-free quantum dot comprising the halide anion on the surface thereof; and
forming the variable resistance layer from the mixed dispersion.

17. The method of claim 16, wherein the mixing of the dispersion comprising the Cd-free quantum dots and the halide solution comprises:
mixing the dispersion comprising the Cd-free quantum dots and the halide solution so that an amount of the halide is about 0.1 weight percent to about 10 weight percent, based on a total weight of the Cd-free quantum dots.

18. The method of claim 14, wherein
the forming of the variable resistance layer comprises:
forming a first variable resistance layer comprising the Cd-free quantum dots comprising the halide anion on the surface thereof, and
forming a second variable resistance layer on the first variable resistance layer, the second variable resistance layer comprising the Cd-free quantum dots not comprising the halide anion on the surface thereof.

19. The method of claim 18, wherein the forming of the variable resistance layer further comprises forming a third variable resistance layer on the second variable resistance layer, the third variable resistance layer comprising the Cd-free quantum dots comprising the halide anion on the surface thereof.

20. A method of manufacturing a resistive memory device, comprising:
providing a first electrode,
forming an auxiliary layer on the first electrode,
preparing a dispersion comprising Cd-free quantum dots,
preparing a halide solution comprising a halide and a polar solvent,
mixing the dispersion comprising the Cd-free quantum dots and the halide solution to convert the Cd-free quantum dots into Cd-free quantum dots comprising a halide anion on the surface thereof and Cd-free quantum dots not comprising the halide anion on the surface thereof,
coating the dispersion comprising the Cd-free quantum dots comprising the halide anion on the surface thereof and the Cd-free quantum dots not comprising the halide anion on the surface thereof on the auxiliary layer to form a variable resistance layer, and
providing a second electrode on the variable resistance layer to manufacture the resistive memory device.

* * * * *